United States Patent
Lee et al.

(10) Patent No.: US 6,818,515 B1
(45) Date of Patent: Nov. 16, 2004

(54) METHOD FOR FABRICATING SEMICONDUCTOR DEVICE WITH LOOP LINE PATTERN STRUCTURE

(75) Inventors: Brian S. Lee, Hsinchu (TW); Chih-Yu Lee, Hsinchu (TW)

(73) Assignee: ProMOS Technologies Inc., Hsinchu (TW)

( * ) Notice: Subject to any disclaimer, the term of this patent is extended or adjusted under 35 U.S.C. 154(b) by 0 days.

(21) Appl. No.: 10/600,466

(22) Filed: Jun. 23, 2003

(51) Int. Cl.[7] ............................................. H01L 21/336
(52) U.S. Cl. ......................................... 438/284; 438/239
(58) Field of Search ............................... 438/284, 197.2, 438/39, 279

(56) References Cited

U.S. PATENT DOCUMENTS 5,418,092 A * 5/1995 Okamoto ........................ 430/5
5,538,833 A    7/1996 Ferguson et al.
2001/0055733 A1 * 12/2001 Irie et al. ...................... 430/396
2002/0102478 A1 *  8/2002 Hasegawa et al. ............. 430/5
2002/0196629 A1 * 12/2002 Terashi ........................ 362/331

FOREIGN PATENT DOCUMENTS

JP    11017146 A  *  1/1999  ......... H01L/27/108

* cited by examiner

Primary Examiner—Eddie Lee
Assistant Examiner—Douglas W. Owens
(74) Attorney, Agent, or Firm—Birch, Stewart, Kolasch & Birch, LLP

(57) ABSTRACT

An alternating phase shift mask with dark loops thereon, a memory array fabricated with the alternating phase shift mask, and a method of fabricating the memory. The dark loops in the mask always separate first regions with 180° phase difference from second regions with 0° phase difference to define active areas or gate-lines in a DRAM chip.

2 Claims, 9 Drawing Sheets

METHOD FOR FABRICATING SEMICONDUCTOR DEVICE WITH LOOP LINE PATTERN STRUCTURE

BACKGROUND OF THE INVENTION

1. Field of the Invention

The present invention relates to a semiconductor device with loop pattern structure and a method of fabricating the same, which only needs an alternating phase shift mask (alt-psm) with single exposure process. The alternating phase shift mask used for fabricating the same is also disclosed.

2. Description of the Related Art

Recently, phase shift technologies, instead of conventional chrome-on-glass (COG) technologies, have been incorporated into the design-to-silicon flow, allowing consistent and reliable reduction of IC feature size and providing a significant improvement in chip performance. As well, smaller feature size for ICs is less costly.

FIG. 1 is a schematic diagram of a conventional COG technology. FIG. 2 is a schematic diagram of an alternating phase shift technology. As shown in FIG. 1, the COG technology uses binary mask, while the alternating phase-shift technology uses alternating phase shift mask (alt-psm), as shown in FIG. 2, having a neighboring pattern with 180° phase difference to produce a negative step waveform (of field amplitude). Thus, such a phase difference on an alt-psm leads to destructive interference of impinging light, thereby eliminating light exposure intensity between two patterns and obtaining higher resolution. Neighboring line pattern layouts with 180° phase difference such as an example of a memory cell layout shown in FIG. 3 are thus produced. Blank or white regions are clear or transparent for light to transmit through, and are denoted as either 180° or 0° to represent the phase differences when light passes through them. Regions with slashes are opaque to block light passing therethrough.

However, manufacturing semiconductor products by using an alt-psm is expensive and with low throughput. Additionally, phase conflict (indicated by a circle in FIG. 3) inevitably occurs at phase edges 30 between alt-psm region 10 (with 180° phase difference) and non-psm region 20 (with 0° phase difference), for example active area structure and/or gate conductor structure, and affects printed features in lithography. Due to destructive interference, an alt-psm region 10 and an adjacent non-psm region 20 always render an almost 0 light intensity region on an exposed subject no matter an opaque region exists between them or not. In FIG. 3 (an alt-psm), region 30 is blank and should refer to an uniformly-exposed region on an exposed subject. However, since an alt-psm region 10 and an adjacent non-psm region 20 adjoin each other in region 30, there is somehow a 0 light intensity region on an exposed subject, creating unwanted images. The unwanted images are currently erased by a trim mask (described in U.S. Pat. No. 5,538,833). However, such an optical lithography requires double exposure (because of the need of an alt-psm and a trim mask), leading to design complexity, difficulty in defect inspection and repair, and layout impact driven by the required trim at high resolutions.

SUMMARY OF THE INVENTION

Accordingly, the object of the present invention is to provide a semiconductor device with loop line pattern structure, which only needs an alternating phase shift mask with single exposure to save the process cost.

The present invention provides an alternating phase shift mask with dark loops thereon, a memory array fabricated with the alternating phase shift mask, and a method of fabricating the memory. The dark loops always separate first regions with 180° phase difference from second regions with 0° phase difference. By using the alternating phase shift mask to pattern gate-lines or active areas in a DRAM array, no unwanted image is created in the DRAM array and only one exposure is needed to achieve high resolution requirement.

BRIEF DESCRIPTION OF THE DRAWINGS

The preferred embodiment of the invention is described with reference to the accompanying drawings in which.

DETAILED DESCRIPTION OF THE INVENTION

Following embodiments for the present invention are introduced with, but not limited to, a Dynamic Random Access Memory (DRAM) chip with a memory array. Each DRAM cell in the memory array has a deep trench (DT) capacitor, a contact to bit-line (CB) and an active area (AA).

Figure 1:
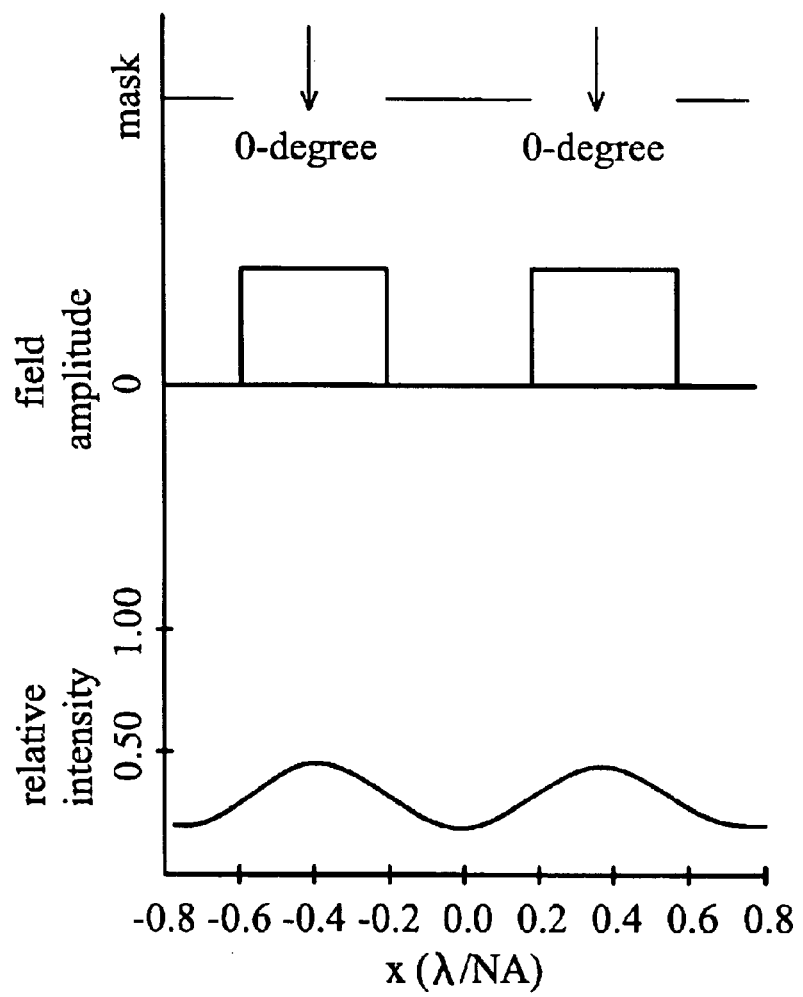
FIG. 1 is a schematic diagram of a conventional COG technology.
Figure 2:
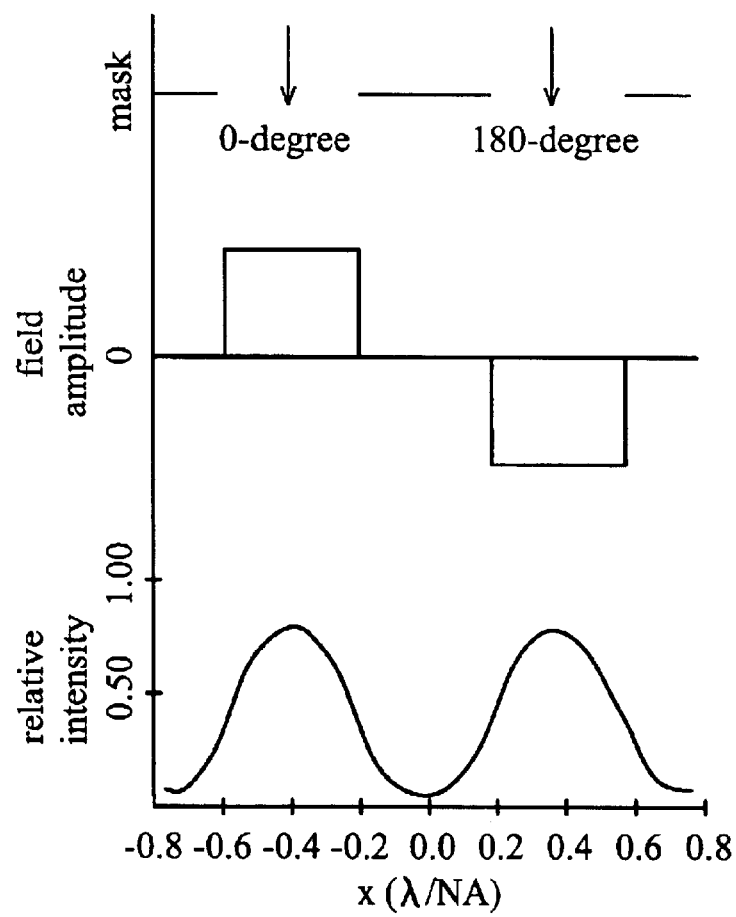
FIG. 2 is a schematic diagram of a typical alternating phase shift technology.
Figure 3:
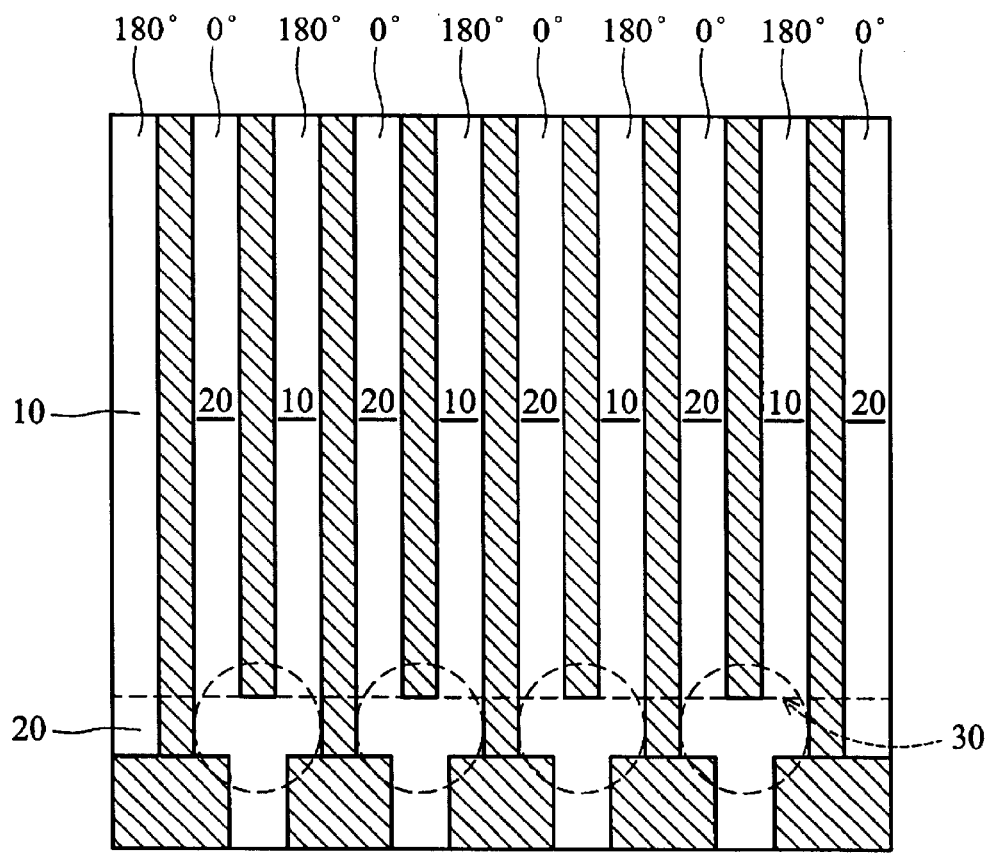
FIG. 3 is a schematic diagram of a layout structure using the mask of FIG. 2.
Figure 4A:
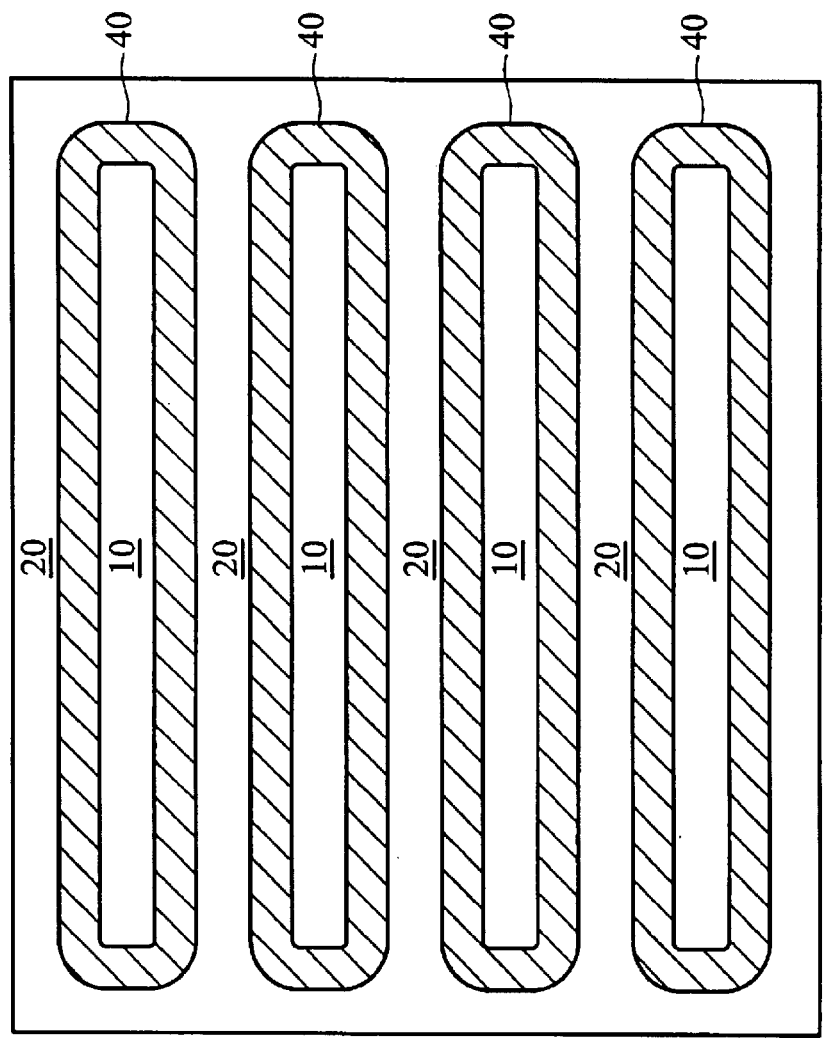
FIG. 4A is an alternating phase shift mask for patterning active areas in a checkerboard memory array of a DRAM chip.

FIG. 4A is an alternating phase shift mask for patterning active areas in a checkerboard memory array of a DRAM chip. Referring to the alternating phase shift mask of FIG. 4A, there are dark loops 40 corresponding active areas on the memory array. The portion enclosed by each dark loop is defined as an alt-psm region 10 with 180° phase difference. The portion between two neighboring loops 40 is an non-psm region 20 with 0° phase difference. Alt-psm regions 10 and non-psm regions 20 are exchangeable in case that the light traversing these two kinds of regions are 180 out of phase.

Figure 4B:
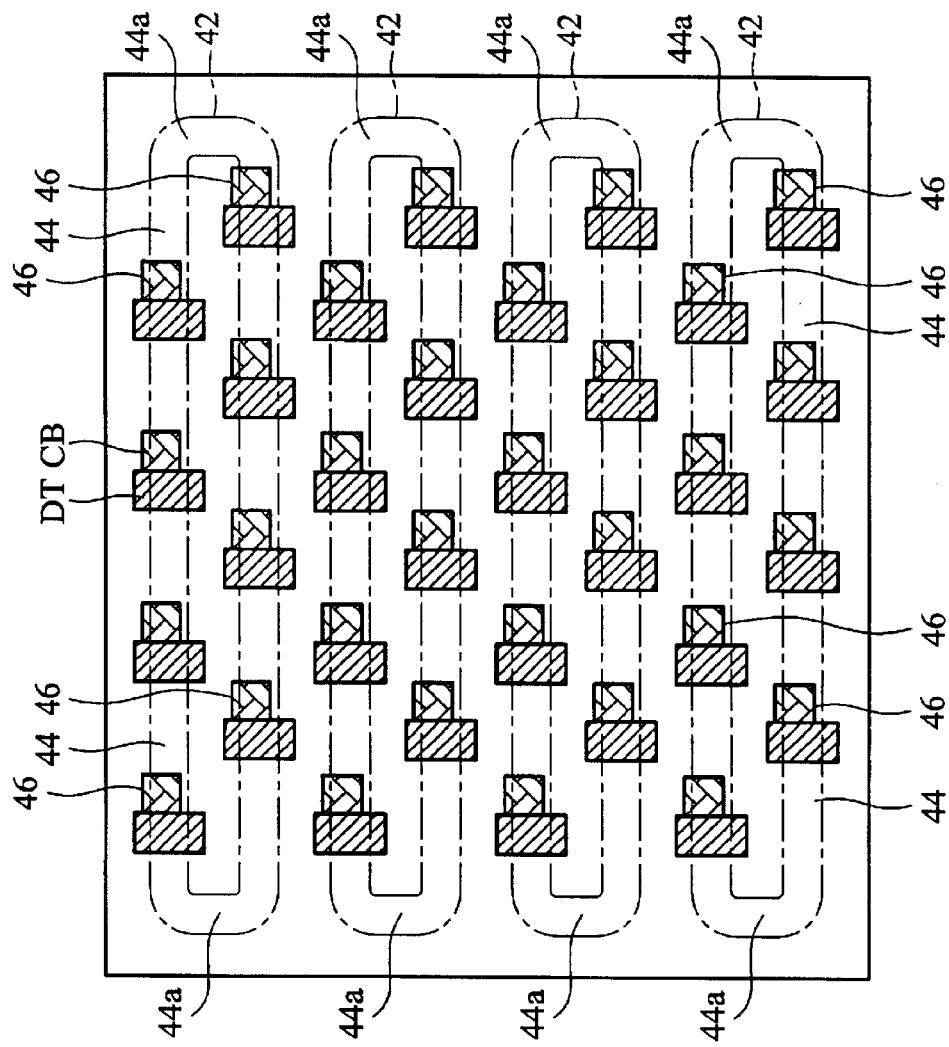
FIG. 4B shows the patterned active areas in the memory array by using the mask in FIG. 4A.

FIG. 4B shows the patterned active areas in the memory array by using the mask in FIG. 4A. Through a lithography process in together with the mask in FIG. 4A and consequent semiconductor processes, active areas can be patterned into a memory array. Because alt-psm regions and non-psm regions are isolated by dark loops on a mask, there is no unwanted image formed in a corresponding memory array and, as a result, no need of a trim mask. Only one time exposure is needed to transfer the pattern on the mask to the memory array. In FIG. 4B, 32 memory cells of Sub-8F2 are arranged in 8 rows and 8 columns and each cell has a deep trench capacitor and a vertical switch transistor. Each dark loop 40 on the mask will form a loop area 42 (as shaped by dash lines in FIG. 4B) in the memory array to protect itself from forming isolation structure, such as shallow trench isolation structure. Therefore, the areas corresponding to non-psm regions 20 and alt-psm regions 10 finally will be processed to have isolation structure. The loop areas 42, due to the protection from the mask, will stay as they were before relevant isolation processes. Those areas left for forming active devices are so named as active areas. Shown in FIG. 4B, active areas 44 patterned by a dark loop 40 in the mask of FIG. 4A are separated by deep trenches (DTs), which are formed in preceding processes. Considering proximity effect, edging cells 46, locating at the two edges of each row, are dummy cells and usually do not provide the function of data memory. Due to the loops on the mask, each edging cell 46 shares one common active area 44a with another edging cell 46 at an adjacent row. This kind of memory array structure in FIG. 4B is suitable for either open bit-line architecture or folded bit-line architecture.

Figure 5A:
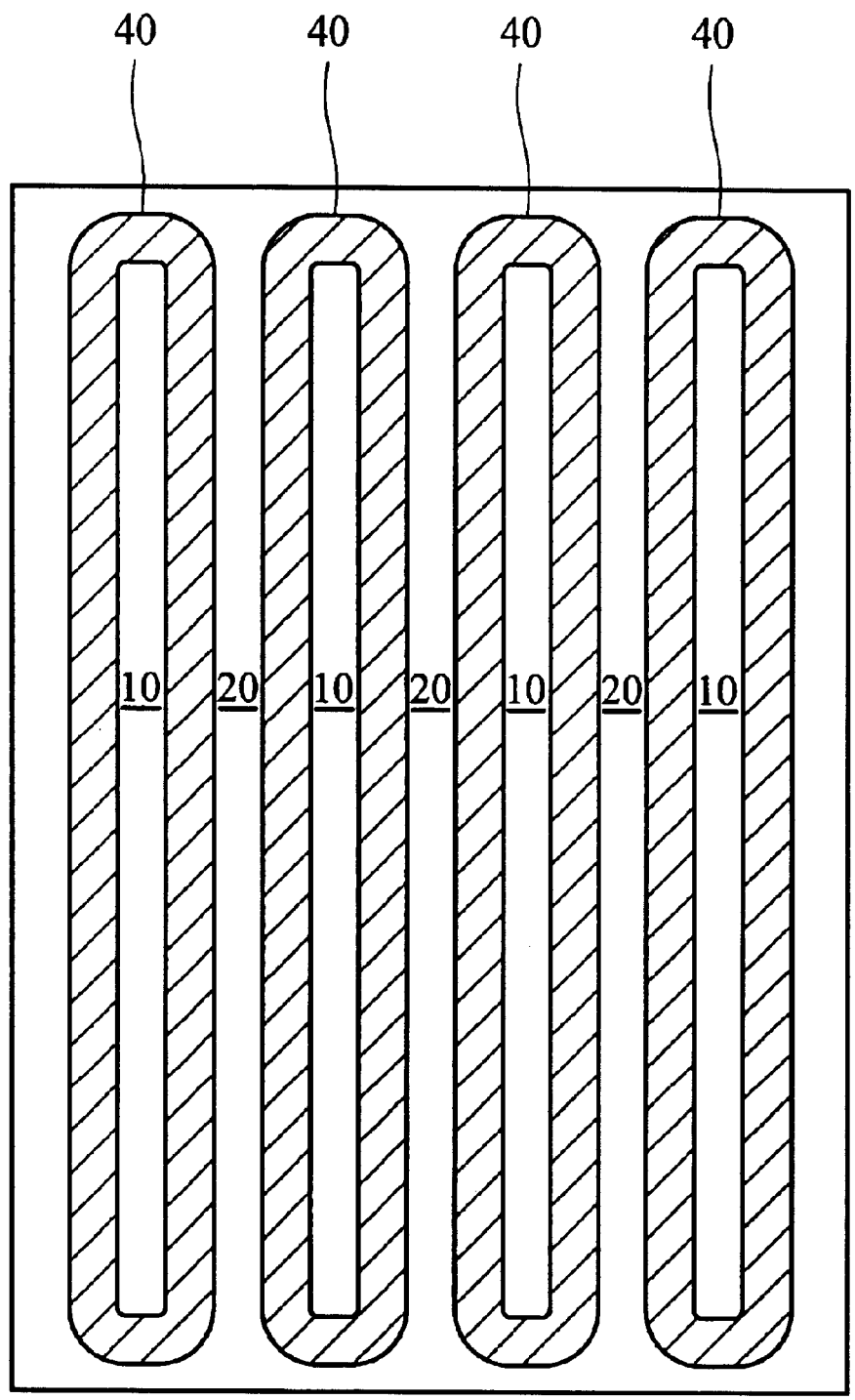
FIG. 5A is an alternating phase-shift mask for defining gate patterns in a DRAM array.
Figure 5B:
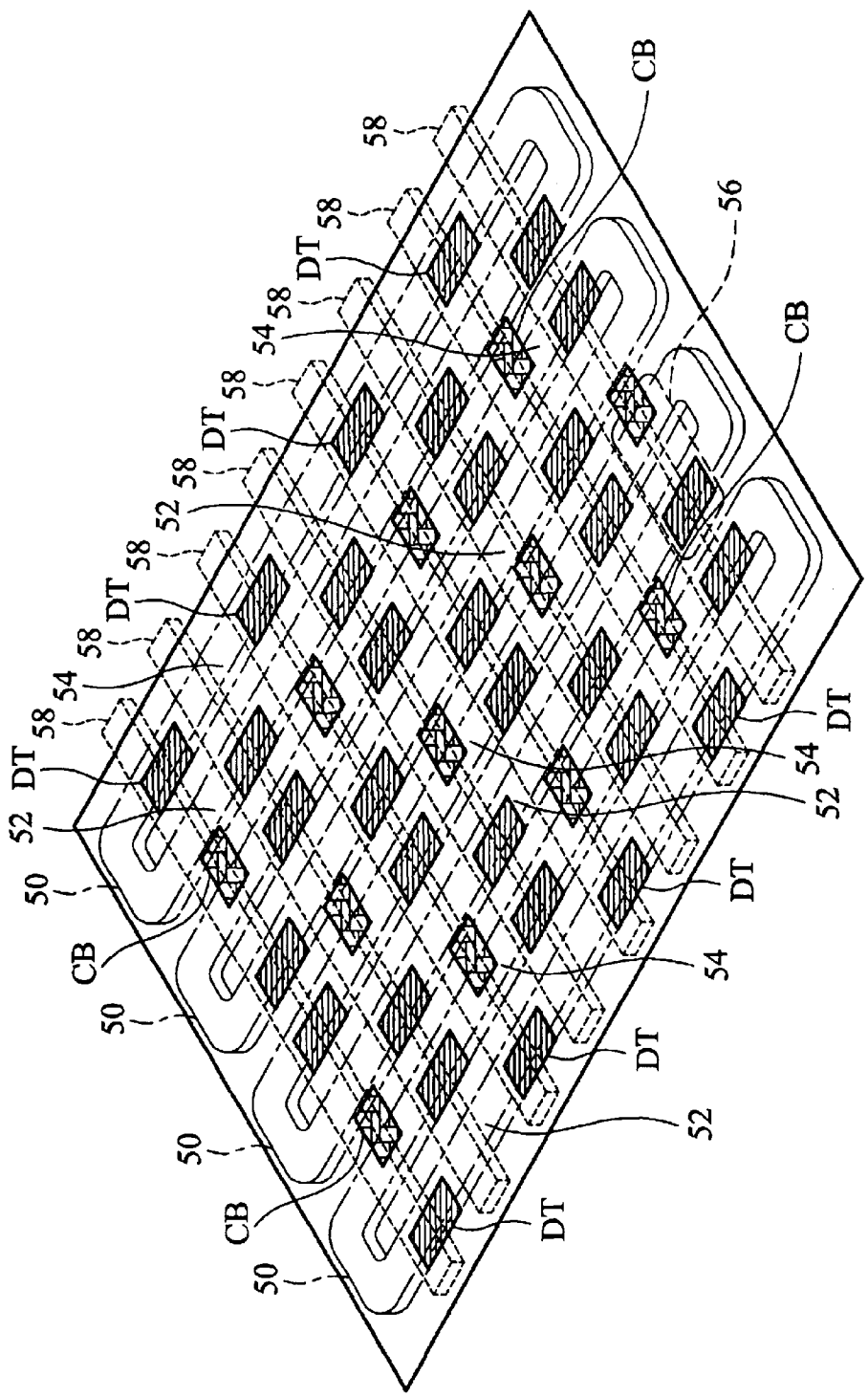
FIG. 5B shows a DRAM array with gate-lines shaped and patterned by the mask in FIG. 5A.

FIG. 5A is an alternating phase-shift mask for defining gate patterns in a DRAM array. FIG. 5B shows a DRAM array with gate-lines 50 shaped and patterned by the mask in FIG. 5A. Similar with the mask in FIG. 4A, FIG. 5A has dark or opaque loops 40 corresponding gate-lines on the memory cell. The alt-psm regions 10 and the non-psm regions 20 in FIG. 5A are defined by the similar definition as that in FIG. 4A, and can also be exchangeable.

FIG. 5B also shows the correlation between the patterned gate-lines and other structures in a DRAM array with 8F2 BEST cells. It is well-known in the art that each 8F2 BEST DRAM cell in FIG. 5B has a deep trench capacitor DT and shares a bit-line contact CB with an adjacent DRAM cell. FIG. 5B shows 4 gate-lines, each having a loop portion 50 corresponding to a dark loop 40 on the mask of FIG. 5A. Each loop portion So has a left straight portion 52 and a right straight portion 54. Taking the DRAM cell 56 for example, the left straight portion 52 passes above the deep trench capacitor of the DRAM cell 56 and has no effect for the cell's operation, while the right straight portion 54 passes the active area between the bit-line contact CB and the deep trench capacitor DT to consist a gate. Such a gate, as well-known in the art, controls the electric connection between the bit-line contact CB and the storage capacitor. Bit-lines will be formed by succeeding processes, each linking the DRAM cells at the same height. For example, the most bottom bit-line links the 4 DRAM cells at the bottom of the DRAM array in FIG. 5B. The cells having gates consisted of different straight portions of a gate-line link to different bit-lines 58, to construct open bit-line architecture.

Figure 6:
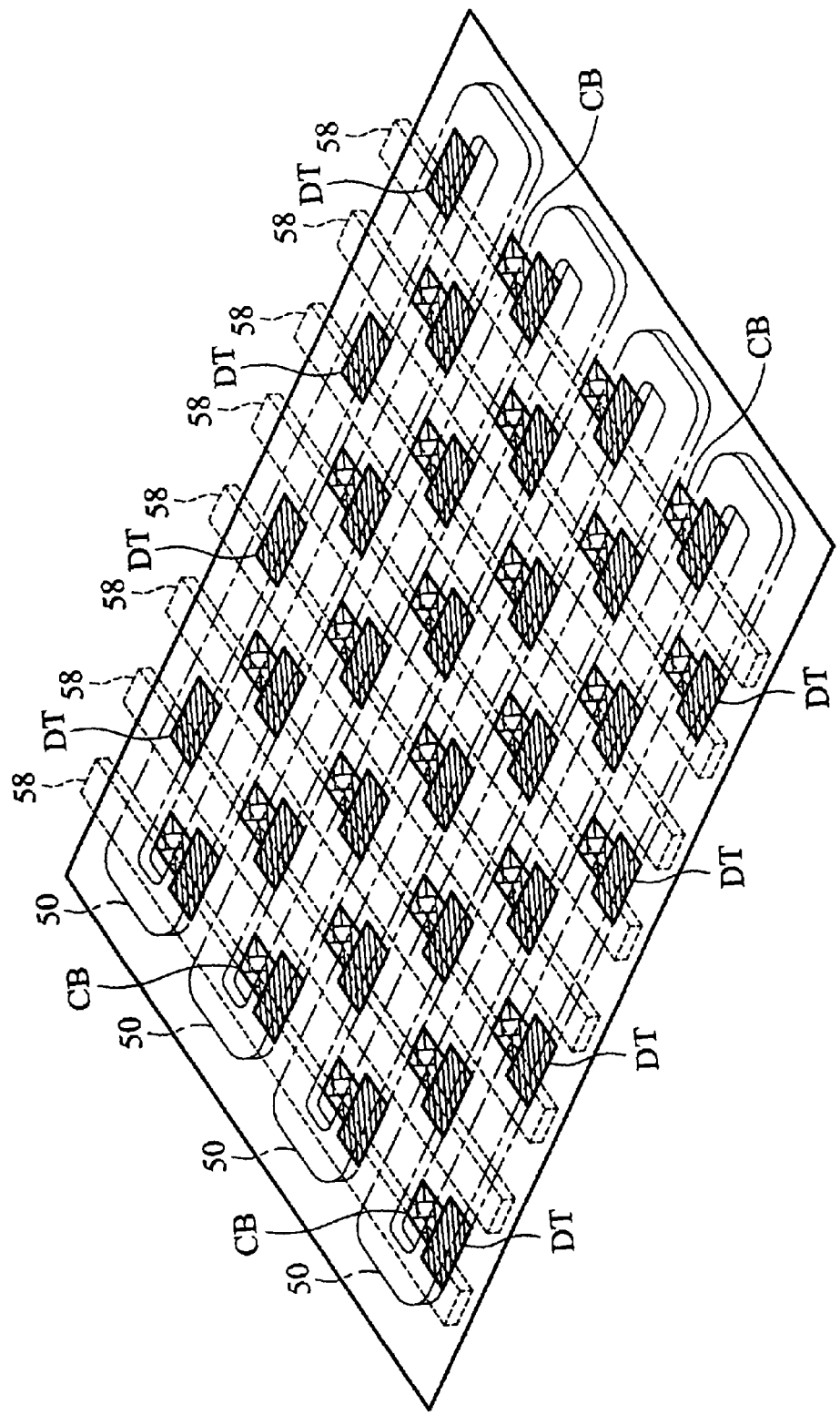
FIG. 6 is another embodiment of agate conductor (GC) structure with loops according to the invention.
Figure 7:
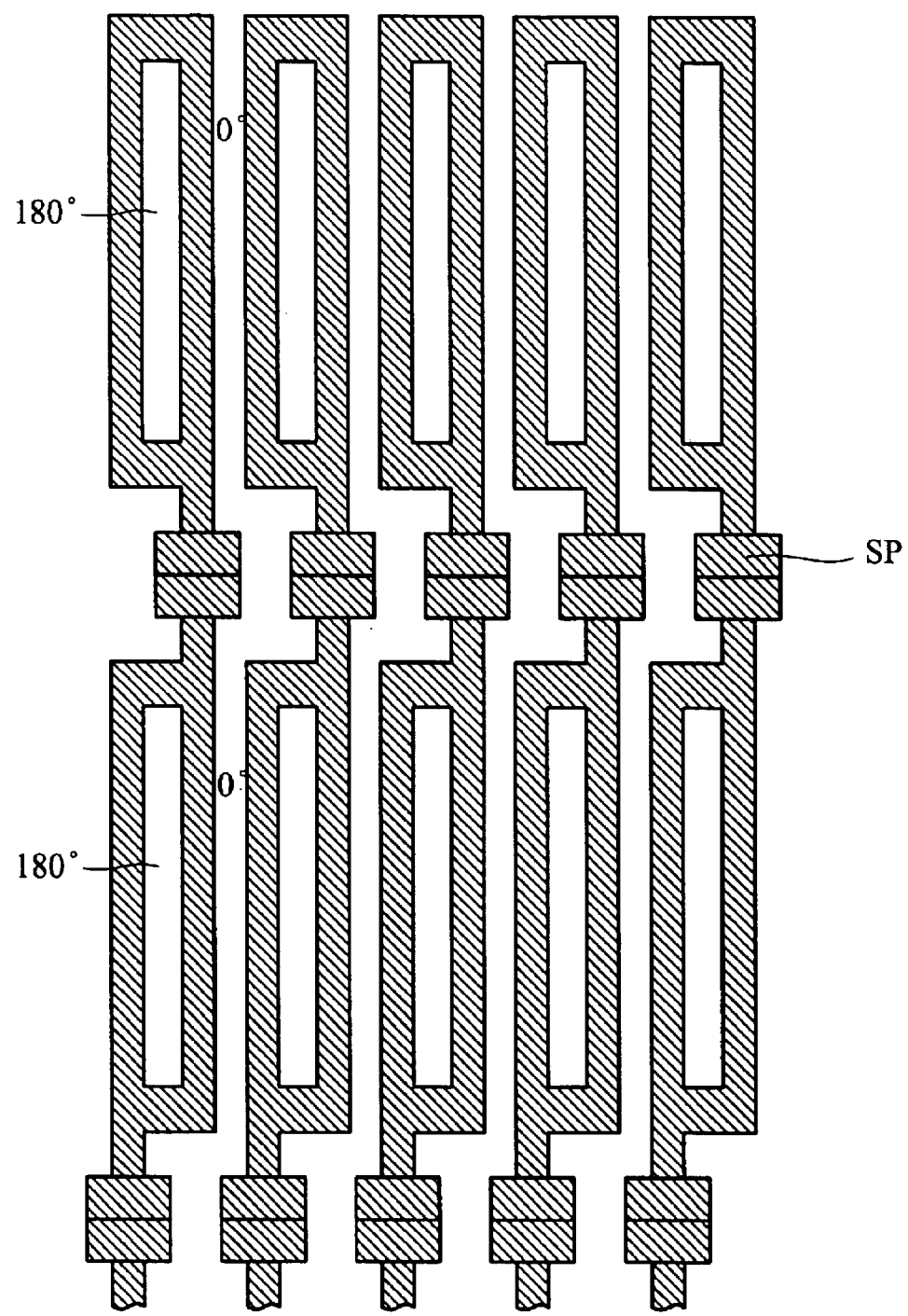
FIG. 7 is an embodiment of gate conductors with connected multi-loops through stitched pads according to the invention.

FIG. 6 shows a DRAM array with gate-lines shaped and patterned by the mask in FIG. 5A. Dislike the FIG. 5B, FIG. 6 shows a DRAM array with Sub-8F2 cells. The vertical switch transistor for a Sub-8F2 cell stacks over the deep trench in the same cell. The vertical switch transistor is connected to and controlled by the gate-line passing above the deep trench of the same cell. In succeeding processes, bit-lines 58 are formed and each bit-line 58 links the Sub-8F2 cells at the same height to construct open bit-line architecture. The gate-lines in FIG. 6 can be used in the same memory array of FIG. 4B, where active areas are defines by a alternating mask with loop patterns. A dark or opaque loop in an alternating phase shift mask needs not to be isolated from the others, as shown in FIG. 7. FIG. 7 is another layout example on a mask for patterning active areas or gate-lines. Through the dark segment in the middle part of FIG. 7, each dark loop in the upper part is connected to a corresponding dark loop in the lower part.

In comparison with the alternating phase shift mask in the prior art, in which contact of each non-psm region and each alt-psm causes the need of a trim mask and double exposure process, the alternating phase shift mask according to the present invention has each non-psm region and each alt-psm region isolated from each other by an opaque loop, eliminates the need of the trim mask and simplifies the overall process.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for manufacturing DRAM chips, comprising:
   providing a first alternating phase-shift mask having:
      opaque lines, each opaque line having a dark loop;
      a first portion enclosed and defined by the dark loop; and
      a second portion adjacent the dark loop, wherein, during a lithography process, first light traversing the first portion and second light traversing the second portion are 180 out of phase;
   patterning, through the lithography process in together with the first alternating phase-shift mask, active areas of a memory array, wherein at least two edging DRAM cello in the memory array share a common active area.

2. A method for manufacturing DRAM chips, comprising:
   providing a first alternating phase-shift mask, having:
      opaque lines, each opaque line having a dark loop;
      a first portion enclosed and defined by the dark loop; and
      a second portion adjacent the dark loop, wherein, during a lithography process, first light traversing the first portion and second light traversing the second portion are 180 out of phase;
   patterning, through the lithography process in together with the first alternating phase-shift mask, gate-lines of a memory array, wherein each gate-line has a loop portion corresponds to the dark loop on the first alternating phase-shift mask.

* * * * *